(12) United States Patent
Azadet

(10) Patent No.: US 7,263,541 B2
(45) Date of Patent: Aug. 28, 2007

(54) MULTI-DIMENSIONAL HYBRID AND TRANSPOSE FORM FINITE IMPULSE RESPONSE FILTERS

(75) Inventor: Kameran Azadet, Morganville, NJ (US)

(73) Assignee: Agere Systems Inc., Allentown, PA (US)

( * ) Notice: Subject to any disclaimer, the term of this patent is extended or adjusted under 35 U.S.C. 154(b) by 584 days.

(21) Appl. No.: 10/610,336

(22) Filed: Jun. 30, 2003

(65) Prior Publication Data

US 2004/0148323 A1 Jul. 29, 2004

Related U.S. Application Data

(60) Provisional application No. 60/443,258, filed on Jan. 28, 2003.

(51) Int. Cl.
G06F 17/10 (2006.01)
(52) U.S. Cl. .................................................. 708/308
(58) Field of Classification Search ................. 708/308
See application file for complete search history.

(56) References Cited

U.S. PATENT DOCUMENTS

| 5,181,198 A | 1/1993 | Lechleider ................. 370/32.1 |
| 5,920,495 A * | 7/1999 | Hicok et al. ................. 708/308 |
| 5,933,530 A * | 8/1999 | Kim ........................... 382/218 |
| 5,983,254 A | 11/1999 | Azadet ........................ 708/300 |

FOREIGN PATENT DOCUMENTS

| JP | 2002236319 A * | 8/2002 |
| WO | WO 00/28663 | 5/2000 |

OTHER PUBLICATIONS

Honig et al., "Multichannel Signal Processing for Data Communications in the Presence of Crosstalk," IEEE Transactions on Communications, vol. 38, No. 4, pp. 551-558 (Apr. 1990).
Mersereau et al., "Two-Dimensional Digital Filtering," Proceedings of the IEEE, vol. 63, No. 4 (Apr. 1975).
Mou, Z., "Efficient 2-D and Multi-D Symmetric FIR Filter Structures," IEEE Transactions on Signal Processing, vol. 42, No. 3 (Mar. 1994).

* cited by examiner

*Primary Examiner*—Tan V. Mai

(57) ABSTRACT

Multi-dimensional finite impulse response filters are disclosed in hybrid and transpose forms. Multi-dimensional signals can be expressed in a vector (or matrix) form to allow multi-dimensional signals to be processed collectively. Known hybrid and transpose FIR filters are extended to the multi-dimensional case to allow multi-dimensional signals to be processed with reduced redundancies. The input signals are vectors with multidimensional components. The disclosed FIR filters include multipliers that perform matrix multiplications with multiple coefficients, and adders for performing vector additions with multiple inputs and outputs. The z-transforms are provided for the disclosed hybrid and transpose multi-dimensional FIR filters.

8 Claims, 3 Drawing Sheets

MULTI-DIMENSIONAL HYBRID AND TRANSPOSE FORM FINITE IMPULSE RESPONSE FILTERS

CROSS REFERENCE TO RELATED APPLICATIONS

This application claims the benefit of U.S. Provisional Application No. 60/443,258, filed Jan. 28, 2003; and is related to U.S. patent application Ser. No. 10/610,335 entitled, "Method and Apparatus for Reducing Noise In an Unbalanced Channel Using Common Mode Component," and U. S. patent application Ser. No. 10/610,334 entitled, "Method And Apparatus Fox Reducing Cross-Talk With Reduced Redundancies," each incorporated by reference herein.

FIELD OF THE INVENTION

The present invention relates generally to digital filter designs, and more particularly, to multi-dimensional finite impulse response filters.

BACKGROUND OF THE INVENTION

Digital filters are commonly employed in signal processing applications. U.S. Pat. No. 5,983,254 to Azadet discloses a number of known finite impulse response (FIR) filter implementations. For example, FIG. 1 shows an FIR filter in the hybrid form. The hybrid form has a reduced number of delay elements overall (relative to the direct and transpose forms), with delay elements in both the input and output paths. The exemplary conventional hybrid FIR filter 100 shown in FIG. 1 has three modules 110-1 through 110-3. Each module, such as module 110-1, provides three taps at multipliers 115-1, 115-2 and 115-3, respectively. Each module 110 includes the same number of delay elements as the number of taps. The delay elements may be embodied, for example, as shift registers. Specifically, delay elements 105-1 and 105-2 are disposed on input path 101, and delay element 105-3 is disposed on output path 111. Delay element 105-2 is inserted between multipliers 115-1 and 115-2. Delay element 105-2 is inserted between multipliers 115-2 and 115-3. Adder 120-3 receives a delayed sum generated by adder 120-4 and a product generated by multiplier 115-3 and generates a sum. Adder 120-2 receives the sum generated by adder 120-3 and a product generated by multiplier 115-2 and generates a sum. Adder 120-1, disposed on output path 111, receives the sum generated by adder 120-2 and a product generated by multiplier 115-1 and generates a sum.

The filter weights for the modules 110-1 through 110-3 shown in FIG. 1 are scalar values, $w_0$ through $w_8$. With the above filter arrangement, the z-transform of the transfer function of filter 100, $H(z)$, can be expressed as follows:

$$H(z)=z^{-1}\{w_0+w_1 z^{-1}+w_2 z^{-2}\}+z^{-3}\{w_3+w_4 z^{-1}+w_5 z^{-2}\}+ \quad (1)$$

where the first term $z^{-1}\{w_0+w_1 z^{-1}+w_2 z^{-2}\}$ corresponds to module 110-1; and the second term $z^{-3}\{w_3+w_4 z^{-1}+w_5 z^{-2}\}$ corresponds to module 110-2. It can be shown that the hybrid form FIR filter 100 shown in FIG. 1 is functionally equivalent to a direct form FIR filter and a transpose form FIR filter (although, beneficially, with fewer delay elements). For a more detailed discussion of such FIR filters, see, for example, U.S. Pat. No. 5,983,254, incorporated by reference herein.

A number of applications require multi-dimensional signals to be processed on FIR filters, such as the FIR filter 100 shown in FIG. 1. For example, two-dimensional and three-dimensional signals are often processed using FIR filters in image filtering and video processing applications. Each dimension of the multi-dimensional signal, however, is typically processed independently. Frequently, however, redundancies result from the same operation, such as a delay, being applied to the same input signal multiple times as each dimension is independently processed. For example, conventional cross-talk cancellers typically consider the same signal on a given twisted pair multiple times in order to reduce the echo on the same twisted pair, as well as the near end cross-talk on each of the other twisted pairs. In the case of four twisted pairs, for example, there is a factor-of-four redundancy, since a given signal is used once for the echo cancellation on the same twisted pair and three additional times for the near end cross-talk on the other three twisted pair. Such redundancies unnecessarily consume circuit area and power. A need therefore exists for multi-dimensional FIR filters that reduce the number of redundancies.

SUMMARY OF THE INVENTION

Generally, multi-dimensional finite impulse response filters in hybrid and transpose forms are disclosed. The present invention recognizes that multi-dimensional signals can be expressed in a vector (or matrix) form to allow multi-dimensional signals to be processed collectively, rather than as a series of independent computations. The present invention extends known hybrid and transpose FIR filters to the multi-dimensional case to allow multi-dimensional signals to be processed with reduced redundancies. In contrast to the above described scalar FIR implementations, the input signals that are applied to the disclosed multi-dimensional FIR filters are vectors with multidimensional components. In addition, the disclosed FIR filters include multipliers that perform matrix multiplications with multiple coefficients, and adders for performing vector additions with multiple inputs and outputs.

The z-transfoxms axe provided for the disclosed hybrid and transpose multi-dimensional FIR filters The multi-dimensional finite impulse response filters used herein have matrix coefficients. Each FIR filter comprises N multipliers having taps with filter weights or tap coefficients, $W_N$, respectively These filter weights, $W_N$, represent matrix multiplicands to be multiplied by input data traversing an input path The multipliers each perform a matrix multiplication operation. The output of each FIR filter can be expressed as:

$$Y(z)=H(z)Tx(z),$$

where $H(z)$ is a matrix, defined herein fox both the transpose and hybrid forms, and $Tx(z)$ is the vector representation of the multi-dimensional signal Each adder performs a vector addition of the multiple components. The disclosed multi-dimensional FIR filters may be employed for example, to cancel noise in a twisted pair environment, such as echo and near and far end cxoss-talk, or to equalize a received signal.

A more complete understanding of the present invention, as well as further features and advantages of the present invention, will be obtained by reference to the following detailed description and drawings.

DETAILED DESCRIPTION

As previously indicated, it has been found that conventional near end cross-talk and echo cancellers typically consider the same signal on a given twisted pair multiple times in order to reduce the echo on the same twisted pair; as well as the cross-talk on each of the other twisted pairs. For example, a transmitted signal Tx1 is used by an echo canceller to remove echo from the received signal on the first twisted pair, and is also used by the near end cancellers for twisted pairs 2 through 4 Thus, redundancies result from the same operation (e.g, a delay) being applied to the same input (e.g, Tx1) four times, The present invention recognizes that the redundancies can be reduced or even removed entirely by processing multi-dimensional signals, such as the various components of a received signal, in a vector form, on a multi-dimensional FIR filter, Thus, the various components of the multi-dimensional signal are processed collectively, rather than as a series of independent computations. It is noted that a vector is merely a special case of a matrix (where the matrix has only a single column), and in some applications, the multi-dimensional signal may be better expressed as a matrix and in other applications, the multi-dimensional signal may be better expressed as a vector; as would be apparent to a person of ordinary skill in the art.

Figure 1:
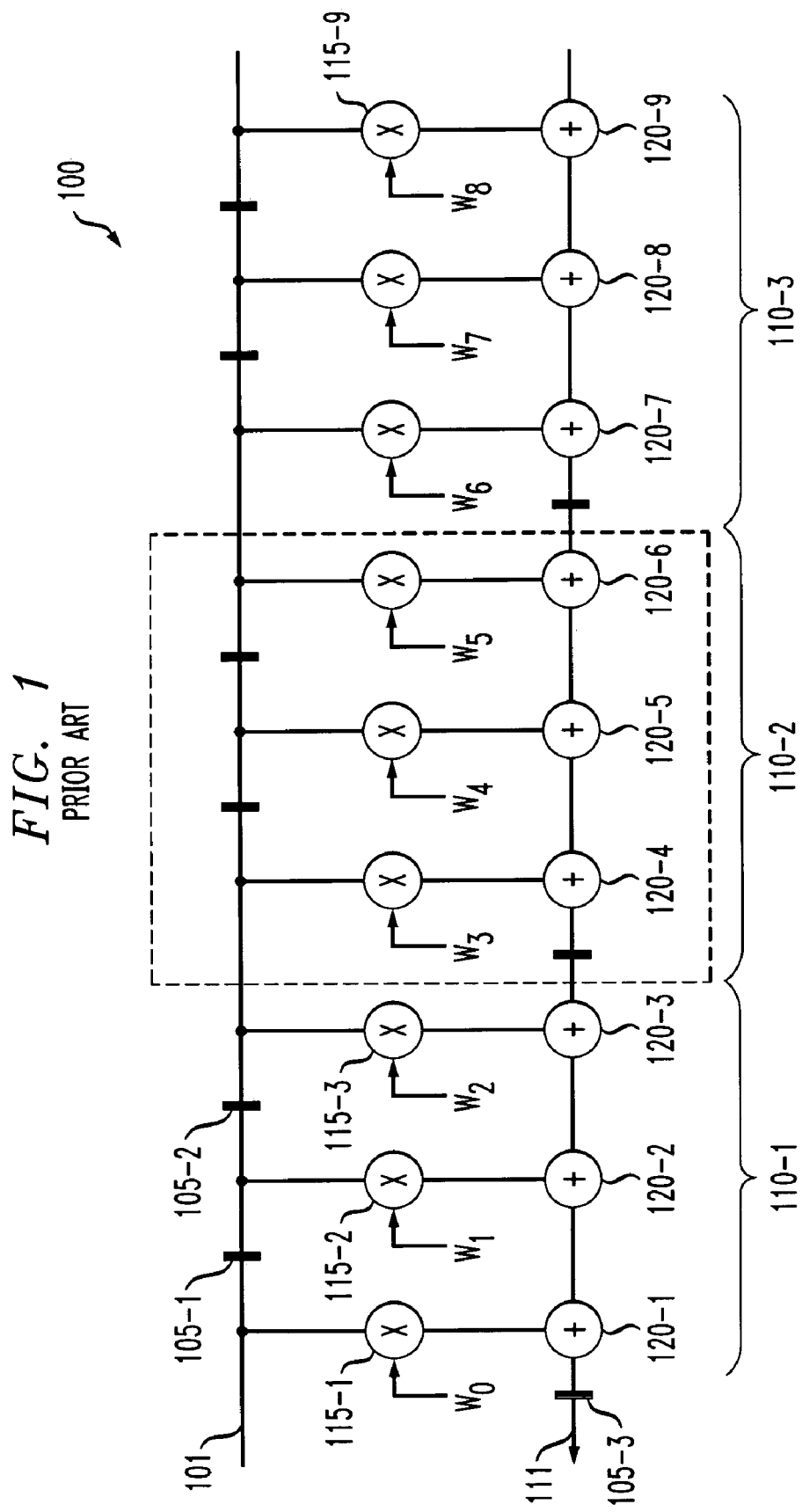
FIG. 1 illustrates a conventional finite impulse response filter in hybrid form having three modules.
Figure 2:
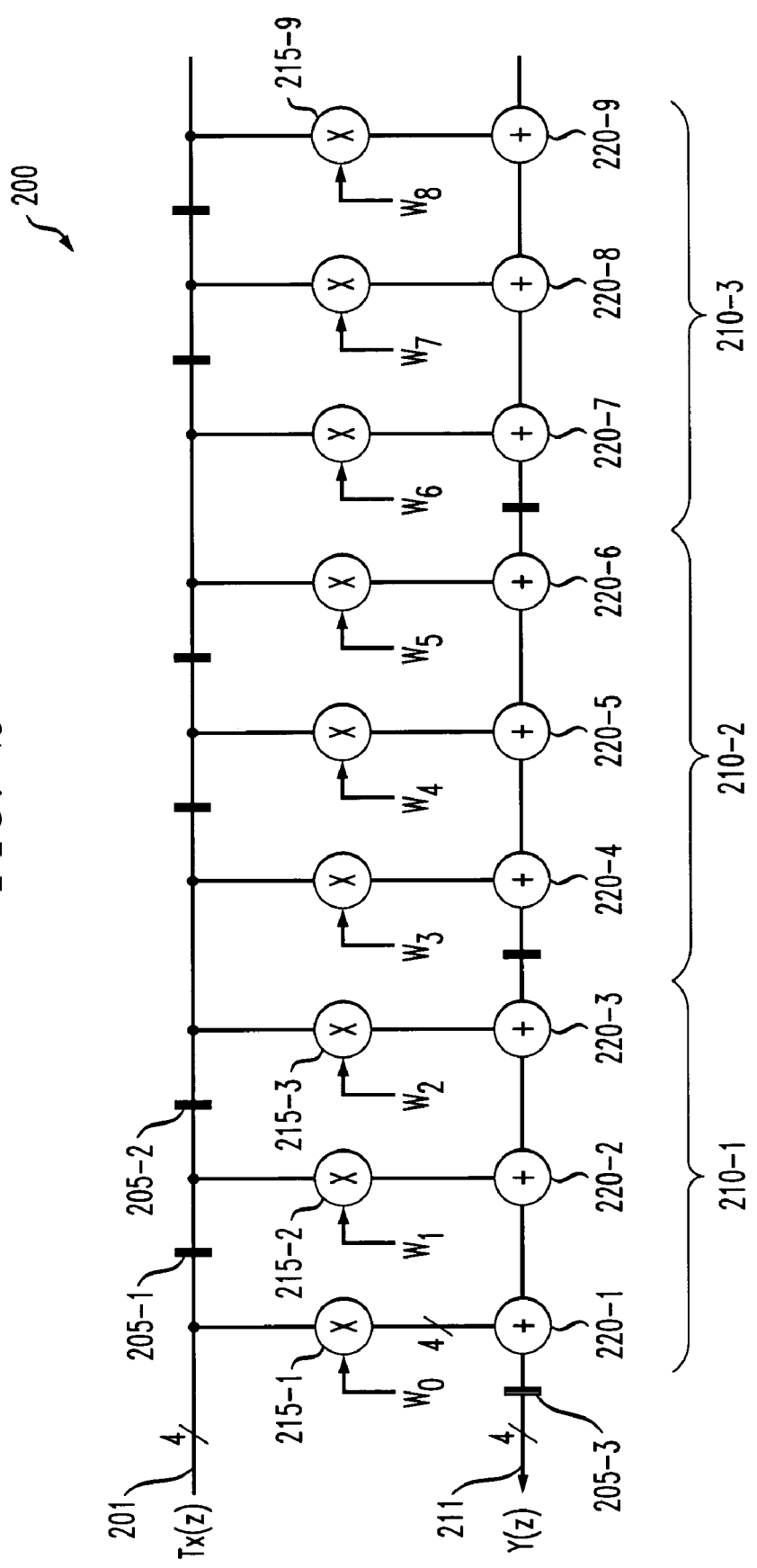
FIG. 2 illustrates a finite impulse response filter in hybrid form incorporating features of the present invention.

FIG. 2 illustrates a multi-dimensional FIR filter 200 in hybrid form incorporating features of the present invention. Thus, the present invention extends the hybrid form of FIR filters to multi-dimensional filters. As shown in FIG. 2, the scalar representation of the input signals are replaced by vectors with multidimensional components, the scalar multiplications become matrix multiplications with multiple coefficients, and the scalar additions become vector additions with multiple inputs and outputs (relative to the conventional hybrid FIR filter 100 shown in FIG. 1).

The FIR filter 200 shown in FIG. 2 has three modules 210-1 through 210-3. Each module, such as module 210-1, provides three taps at multipliers 215-1, 215-2 and 215-3, respectively. Each module 210 includes the same number of delay elements as the number of taps. Specifically, delay elements 205-1 and 205-2 are disposed on input path 201, and delay element 205-3 is disposed on output path 211. Delay element 205-2 is inserted between multipliers 215-1 and 215-2. Delay element 205-2 is inserted between multipliers 215-2 and 215-3. Adder 220-3 receives a delayed sum generated by adder 220-4 and a product generated by multiplier 215-3 and generates a sum. Adder 220-2 receives the sum generated by adder 220-3 and a product generated by multiplier 215-2 and generates a sum. Adder 220-1, disposed on output path 211, receives the sum generated by adder 220-2 and a product generated by multiplier 215-1 and generates a sum.

According to one aspect of the invention, the filter weights for the modules 210-1 through 210-3 shown in FIG. 2 are matrix values, $W_0$ through $W_8$. With the above filter arrangement, the z-transform of the transfer function of filter 100, H(z), can be expressed as follows:

$$H(z)=z^{-1}\{W_0+_1z^{-1}+W_2z^{-2}\}+z^{-3}\{W_3+W_4z^{-1}+W_5z^{-2}\}+ \quad (1)$$

where the first term $z^{-1}\{W_0+W_1z^{-1}+W_2z^{-2}\}$ corresponds to module 210-1; and the second term $z^{-3}\{W_3+W_4z^{-1}+W_5z^{-2}\}$ corresponds to module 210-2.

Generally, the multi-dimensional finite impulse response (FIR) filters of the present invention process multi-dimensional signals in a vector (or matrix) form. In this manner, the multi-dimensional signal can be processed collectively, rather than as a series of independent computations. The present invention recognizes that multi-dimensional signals, such as the received signal for each twisted pair in a cross talk canceller, can be expressed in a vector form. The vector representation of a received signal includes, for example, four elements, Rx1, Rx2, Rx3 and Rx4, in the four twisted pair case.

The multi-dimensional finite impulse response filters used herein have matrix coefficients. As shown in FIG. 2, the FIR filter 200 comprises N multipliers 215 having taps with filter weights or tap coefficients, $W_N$, respectively. These filter weights represent matrix multiplicands to be multiplied by input data traversing input path 201. It is noted that for a conventional implementation, the weights, $w_n$, applied to each filter tap are scalar values while the weights, $W_n$, applied to each filter tap in the present invention are matrix values (such as a 4 by 4 matrix).

The multipliers 215 each perform a matrix multiplication operation. For example, for four twisted pairs in a cross talk canceller, each multiplication is a multiplication of a 4 by 4 matrix by a four component vector. As shown in FIG. 2, the output of the FIR filter 200 can be expressed as:

$$Y(z)=H(z)Tx(z),$$

where H(z) is a matrix, defined above, and Tx(z) is the vector representation of the multi-dimensional signal. In addition, the adders 220-1 through 220-9 each perform a vector addition of the multiple components. The hybrid form FIR filter 200, shown in FIG. 2, may be employed for example, to cancel noise in a twisted pair environment, such as echo and near and far end cross-talk, or to equalize a received signal, as described in United States patent application entitled, "Method And Apparatus For Reducing Cross-Talk With Reduced Redundancies," (Attorney Docket Number Azadet 25), incorporated by reference herein.

Figure 3:
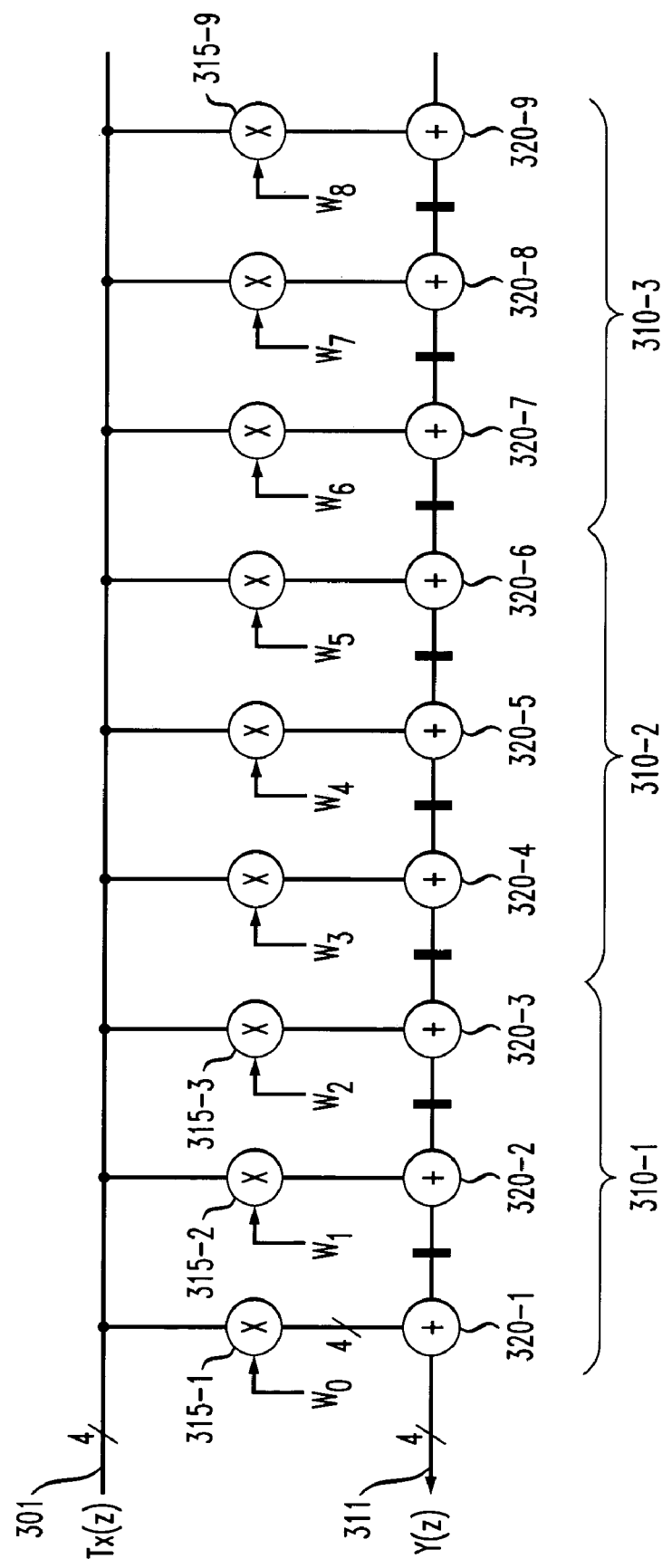
FIG. 3 illustrates a finite impulse response filter in transpose form incorporating features of the present invention.

FIG. 3 illustrates a multi-dimensional FIR filter in transpose form, incorporating features of the present invention. Thus, the present invention extends the transpose form of FIR filters to multi-dimensional filters. As shown in FIG. 3, the scalar representation of the input signals are replaced by vectors with multidimensional components, the scalar multiplications become matrix multiplications with multiple coefficients, and the scalar additions become vector additions with multiple inputs and outputs, relative to a conventional transpose form FIR filter.

The z-transform of the transfer function of the FIR filter 300, H(z), is:

$$H(z)=W_0+W_1z^{-1}+W_2z^{-2}+W_3z^{-3}+ \quad (2)$$

For example, the first weight term, $W_0$, in the above equation corresponds to no delay and the second term, $W_1z^{-1}$, corresponds to one stage of delay. It is noted that for a conventional implementation, the weights, $w_n$, applied to each filter tap are scalar values while the weights, $W_n$, applied to each filter tap in the filter 300 of the present invention are matrix values (such as a 4 by 4 matrix). For a further discussion of conventional transpose form finite impulse response filters, see, for example, U.S. Pat. No. 5,983,254, incorporated by reference herein. It is noted that unlike the direct form of FIR filter, there are no delay elements in the input path of the transpose form.

Rather, in accordance with the transpose form, each of the delay elements are disposed on output path 311 and are each inserted between multiplier/adder pairs 315, 320. Thus, the critical path in the multi-dimensional filter 300 includes a multiplier 315 and an adder 320, resulting in the maximum computation delay incurred by a multiplication and an addition. Furthermore, such computation delay does not depend on the length, or the number of taps, of filter 300.

As indicated above, the multi-dimensional finite impulse response filters used herein have matrix coefficients. The FIR filter 300 of FIG. 3 comprises N multipliers 315 having taps with filter weights or tap coefficients, $W_N$, respectively. These filter weights represent matrix multiplicands to be multiplied by input data traversing input path 301. It is noted that for a conventional implementation, the weights, $W_n$, applied to each filter tap are scalar values while the weights, $W_n$, applied to each filter tap in the present invention are matrix values (such as a 4 by 4 matrix).

The multipliers 315 each perform a matrix multiplication operation. For example, for four twisted pairs in a cross talk canceller, each multiplication is a multiplication of a 4 by 4 matrix by a four component vector. As shown in FIG. 3, the output of the FIR filter 300 can be expressed as:

$$Y(z)=H(z)Tx(z),$$

where H(z) is a matrix, defined above, and Tx(z) is the vector representation of the multi-dimensional signal. In addition, the adders 320-1 through 320-9 each perform a vector addition of the multiple components. The transpose form FIR filter 300, shown in FIG. 3, may be employed for example, to cancel noise in a twisted pair environment, such as echo and near and far end cross-talk, or to equalize a received signal, as described in United States patent application entitled, "Method And Apparatus For Reducing Cross-Talk With Reduced Redundancies," (Attorney Docket Number Azadet 25), incorporated by reference herein.

It is to be understood that the embodiments and variations shown and described herein are merely illustrative of the principles of this invention and that various modifications may be implemented by those skilled in the art without departing from the scope and spirit of the invention.

I claim:

1. A multi-dimensional digital filter having a predetermined number of multipliers, comprising:

a plurality of delay elements, the number of said delay elements being not greater than said predetermined number of multipliers;

a plurality of adders each performing at least one vector addition;

a first path for transporting input data to the filter, wherein said input data is a multi-dimensional vector; and a second path for transporting data in the filter to an output thereof, at least a first one of said plurality of delay elements being disposed on said first path, at least a second one of said plurality of delay elements being disposed on said second path, at least one of said multipliers being coupled between said first path and said second path, and at least one of said adders being disposed on said second path, wherein each of said predetermined number of multipliers performs a matrix multiplication.

2. The multi-dimensional filter of claim 1, wherein each of said delay elements comprises a shift register.

3. The multi-dimensional filter of claim 1, further comprising a plurality of taps, wherein each tap provides a filter weight to a respective one of said multipliers.

4. The multi-dimensional filter of claim 1, wherein said filter is a finite impulse response (FIR) filter.

5. The multi-dimensional filter of claim 1, wherein said filter removes echo flow a received signal.

6. The multi-dimensional filter of claim 1, wherein said filter removes noise from a received signal.

7. The multi-dimensional filter of claim 1, wherein said filter removes cross-talk from a received signal.

8. The multi-dimensional filter of claim 1, wherein said filter equalizes a received signal.

* * * * *